United States Patent
Gao

(10) Patent No.: US 11,681,338 B2
(45) Date of Patent: Jun. 20, 2023

(54) INTEROPERABLE SERVER POWER BOARD SUPPORT STRUCTURE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/192,729

(22) Filed: Mar. 4, 2021

(65) Prior Publication Data
US 2022/0283614 A1 Sep. 8, 2022

(51) Int. Cl.
*H05K 7/14* (2006.01)
*G06F 1/18* (2006.01)

(52) U.S. Cl.
CPC ........... *G06F 1/188* (2013.01); *H05K 7/1491* (2013.01); *H05K 7/1492* (2013.01)

(58) Field of Classification Search
CPC . G06F 1/18; G06F 1/188; G06F 1/183; G06F 1/184; G06F 1/185; G06F 1/186; G06F 1/187; H05K 7/14; H05K 7/1492; H05K 7/1457; H05K 7/1438; H05K 7/1487; H05K 7/16; H05K 7/183; H05K 7/1491; H05K 7/1474; H05K 7/1482; H05K 7/1432; H05K 7/14325; H05K 7/14329; H05K 7/18; H05K 7/1414; H05K 7/1417; H01R 25/14; H04Q 1/023
USPC ..................................................... 361/679.02
See application file for complete search history.

(56) References Cited

U.S. PATENT DOCUMENTS

| | | | |
|---|---|---|---|
| 9,693,477 B1 * | 6/2017 | Ehlen .................. | H05K 7/1492 |
| 11,177,618 B1 * | 11/2021 | Tunks ................. | H05K 7/1492 |
| 2003/0213757 A1 * | 11/2003 | Rumney .............. | H05K 7/1421 312/265.4 |
| 2004/0020874 A1 * | 2/2004 | Haney ................. | H05K 7/1421 211/26 |
| 2012/0155027 A1 | 6/2012 | Broome et al. | |
| 2014/0240914 A1 * | 8/2014 | Meert .................. | G06F 9/4411 361/679.02 |

(Continued)

FOREIGN PATENT DOCUMENTS

| | | |
|---|---|---|
| CN | 210270727 U | 4/2020 |
| EP | 3454632 A1 | 3/2019 |

(Continued)

*Primary Examiner* — Adrian S Wilson
*Assistant Examiner* — Gage Crum
(74) *Attorney, Agent, or Firm* — Womble Bond Dickinson (US) LLP

(57) ABSTRACT

In one embodiment, an apparatus for mounting a power module to a server chassis includes a first rail member attachable to a server chassis and a second rail member mountable to the first rail member. The second rail member includes several mounting points. The apparatus further includes a power distribution board (PDB) coupled to the second rail member at one of the mounting points. The PDB connects power from a power bus of an electronic rack to a server included in the server chassis populated on the rack. The PDB includes one or more power conversion devices to regulate power to the one or more electronic devices of the server and a set of power clips to attach the PDB to a power bus of an electronic rack. The coupling of the PDB and the rails enable connections to different electronic racks.

18 Claims, 9 Drawing Sheets

(56) References Cited

U.S. PATENT DOCUMENTS

| | | | | |
|---|---|---|---|---|
| 2014/0308828 A1* | 10/2014 | Ehlen | ................... | H05K 7/1492 |
| | | | | 439/110 |
| 2015/0245531 A1* | 8/2015 | Meinecke | .......... | H05K 7/20736 |
| | | | | 361/679.02 |
| 2017/0164505 A1* | 6/2017 | Sarti | .................... | H01R 25/142 |
| 2018/0220546 A1* | 8/2018 | Meldrum | ............ | H05K 7/1457 |
| 2019/0215979 A1* | 7/2019 | Chen | ................... | H05K 7/1492 |

FOREIGN PATENT DOCUMENTS

| | | | |
|---|---|---|---|
| JP | 2002164677 | A | 6/2002 |
| JP | 2011070374 | A | 4/2011 |
| JP | 2015507256 | A | 3/2015 |
| JP | 2015099609 | A | 5/2015 |
| JP | 2016091127 | A | 5/2016 |
| JP | 2017508212 | A | 3/2017 |
| JP | 2019102543 | A | 6/2019 |
| JP | 2019128990 | A | 8/2019 |
| JP | 2020088214 | A | 6/2020 |
| JP | 2020150010 | A | 9/2020 |

\* cited by examiner

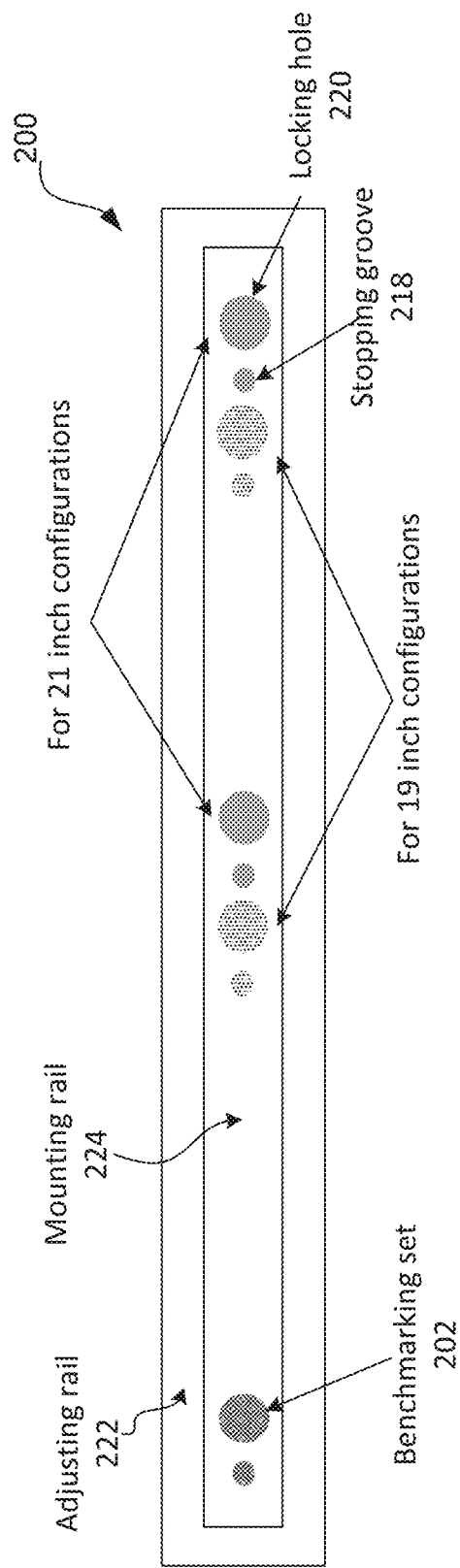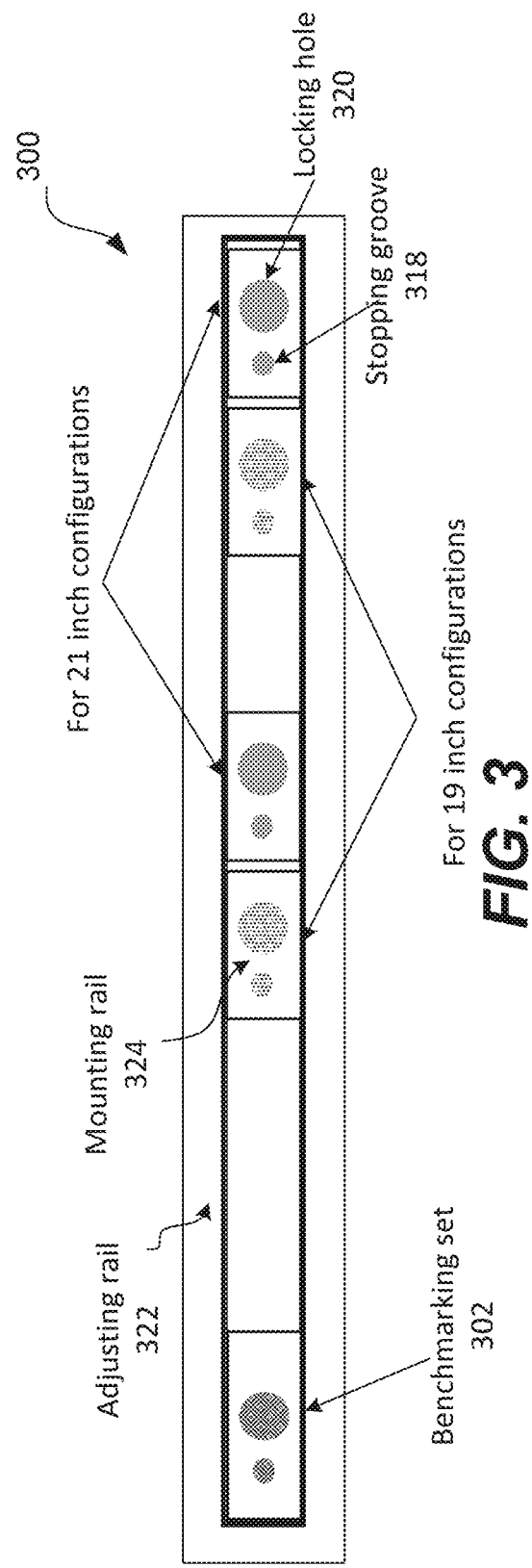

INTEROPERABLE SERVER POWER BOARD SUPPORT STRUCTURE

FIELD OF THE DISCLOSURE

Embodiments of the present invention relate generally to servers. More particularly, embodiments of the invention relate to an interoperable server power board support structure design.

BACKGROUND

Data centers can include many server racks, each server rack including several shelves where a server can be inserted. Each of the servers included in a server rack must be coupled to a power source. A server rack can include one or more power buses (e.g., attached along the rear of the server rack) to provide power to each of the servers. A power distribution board of each server is coupled to the bus bars and the server to convert the power provided by the bus bars to the corresponding power requirements of the server.

Many different bus bar configurations may be used for a server rack and server racks can have different form factors (e.g., widths) for the server shelves. Therefore, the configuration of the power distribution board for each server must match the bus bar configuration for the server rack in which it is to operate. Conventional server chassis include one or more power distribution modules that are fixed in a single position. Accordingly, redesign of the power delivery system on the server side to provide compatibility across configurations can be costly in terms of time and hardware costs. In addition, in some circumstances physical migration of the servers from one cluster to another may be necessary, which requires the server systems have high interoperability.

BRIEF DESCRIPTION OF THE DRAWINGS

Embodiments of the invention are illustrated by way of example and not limitation in the figures of the accompanying drawings in which like references indicate similar elements.

FIG. 2 depicts an example of a mounting structure, according to embodiments of the disclosure.

FIG. 3 depicts another example of a mounting structure, according to embodiments of the disclosure

DETAILED DESCRIPTION

Figure 1:
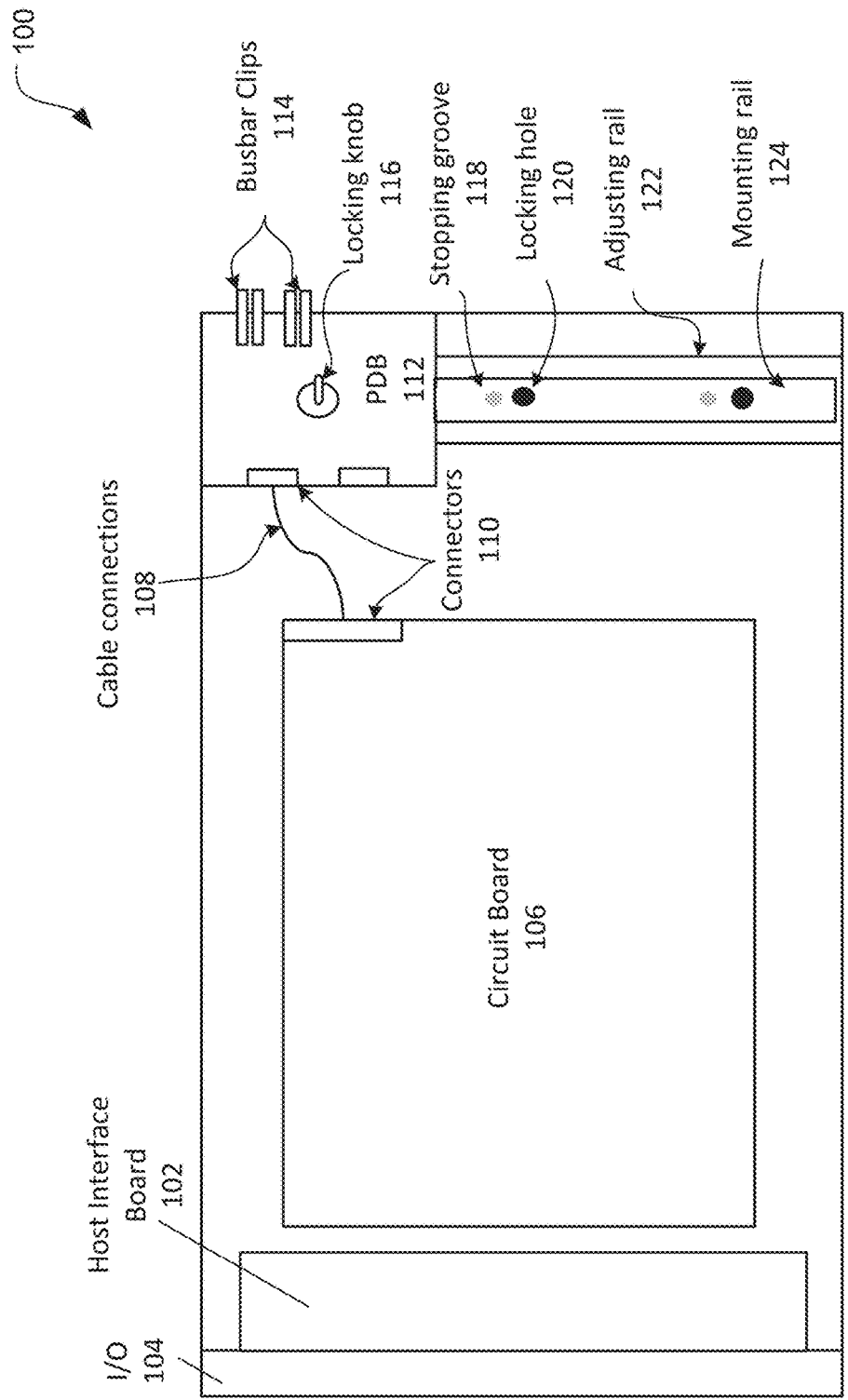
FIG. 1 is a diagram of a mounting structure for a PDB of a server chassis, according to embodiments of the disclosure.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The present disclosure solves the problem of interoperability of power delivery system designs of a server. Embodiments of the disclosure provides a flexible mechanical design for a power delivery module mounting structure. The mounting structure provides for several attachment locations of the power delivery module within the server chassis for compatibility with different rack configurations and corresponding bus bar locations. The design may include a mounting rail dedicated for different types of rack configurations. For example, the attachment locations for different configurations may be predesigned on the mounting rail to be compatible with different rack bus bar locations. The PDB may be assembled on the mounting rail and fixed on an adjusting rail that is fixed to the server chassis. The adjustment rail may be attachable at different vertical positions within the server chassis for vertical adjustment of the power distribution module for different server designs. The position of the power distribution module may be adjusted along the adjusting rail to be interoperable with several different server chassis and server rack configurations.

According to one embodiment, an apparatus for mounting a power module to a server chassis includes a first rail member attachable to a server chassis and a second rail member mountable to the first rail member. The second rail member includes several mounting points. The apparatus further includes a power distribution board (PDB) coupled to the second rail member at one of the mounting points. The PDB provides power from a power bus of an electronic rack to one or more servers in the server chassis populated on the rack. The PDB includes one or more power conversion devices to provide power to the one or more electronic devices of the server and a set of power clips to attach the PDB to a power bus of an electronic rack.

In one example, the second rail member is adjustable along a length of the first rail member. In one example, each of the mounting points of the second rail member includes a stopping groove to provide resistance to movement along the second rail member and a locking hole for fixing the PDB and the second rail member to the first rail member using an attachment mechanism.

In one example, the mounting points include several mounting point groups corresponding to server rack configurations and power hardware designs. In one example, the apparatus further includes one or more side mounting structures attachable to a side of the server chassis. The first rail member may be attachable to the server chassis via the side mounting structures. In one example, the second rail member includes several sectional members that are each individually adjustable along the first rail member. In another example, the first rail member includes a second set of stopping grooves associated with a third set of stopping grooves of the second rail member, the second and third set of stopping grooves to provide resistance to movement of the section members of the second rail member along a length of the first rail member.

According to one embodiment, an electronic rack of a data center includes server shelves each to receive a server chassis. Each server chassis includes a first rail member, a second rail member mountable to the first rail member, the second rail member including multiple mounting points. Each server chassis may include a power distribution board (PDB) coupled to the second rail member at one of the mounting points, wherein the PDB is to provide power from a power bus of an electronic rack to one or more electronic devices of a server included in the server chassis. The PDB includes one or more power conversion devices to provide power to the one or more electronic devices of the server and a set of power clips to attach the PDB to a power bus of an electronic rack.

According to another embodiment, a method of configuring a power distribution board (PDB) in a server chassis includes installing a first rail member to the server chassis and mounting a second rail member to the first rail member, the second rail member including multiple mounting points. The method further includes attaching a power distribution board (PDB) to the second rail member at one of the mounting points, wherein the PDB is to provide power from a power bus of an electronic rack to one or more electronic devices of a server included in the server chassis. The PDB includes one or more power conversion devices to provide power to the one or more electronic devices of the server and a set of power clips to attach the PDB to a power bus of an electronic rack.

FIG. 1 is a top view system diagram of server chassis configuration with an adjustable mounting structure for a power distribution module, according to one embodiment. FIG. 1 presents a design concept diagram. The server chassis may be assembled with a printed circuit board, a host interface board, or any other type of logic board to perform operations of the server. The server chassis may also include an input/output (I/O) interface, and so forth. The server chassis can further include a mounting structure for a power distribution module to be mounted to the server chassis. A power distribution module can include bus bar clips, power converting electronics and control electronics. The PDB is connected to the circuit board and other electronics through cables for providing power to the electronics boards. The PDB can be mounted on a mounting rail and the mounting rail can be attached to the chassis via an adjusting rail. Additionally, the adjusting rail can include a stopping groove for providing a damping of movement of the mounting rail along the adjusting rail at different positions on the adjusting rail. Similarly, the mounting rail can include stopping grooves provide damping of movement of the PDB on the mounting rail. The adjusting rail and the mounting rail can each include a locking hole for fixing the entire assembly (i.e., the PDB, the mounting rail, and the adjusting rail) together at locations corresponding to bus bar locations of the server rack.

In one embodiment, referring to FIG. 1, the server chassis 100 includes I/O 104 for communications to and from the circuit board 106 of the server chassis 100. The server chassis also includes a host interface board 102 and circuit board 106. In one embodiment, circuit board 106 may be a main printed circuit board. Circuit board 106 may include one or more central processing units (CPUs) or graphics processing units (GPUs) for performing operations and calculations. In another embodiment, circuit board 106 may include a server storage solution (e.g., persistent storage) such as a data store, database, or other data storage.

In one embodiment, PDB 112 provides power to the circuit board 106 between connections 108 via connectors 110. For example, connectors 110 may be connecting cables that provide power between the cable connections 108 of the PDB and the circuit board 106. In one embodiment, the PDB 112 is mounted on a mounting structure including an adjusting rail 122 and mounting rail 124. Adjusting rail 122 can be fixed to the sides of the server chassis 100. The mounting rail 124 can be a rail member that is mounted and adjustable along the adjusting rail 122. The mounting rail 124 can include several stopping grooves 118 and locking holes 120. The stopping grooves 118 may provide resistance to movement of the PDB 112 along the mounting rail 124 at particular points along the mounting rail 124 corresponding to mounting locations for the PDB 112. The mounting locations may correspond to a busbar location of a server rack configuration. At each mounting location a locking hole 120 may be provided to fix the PDB into place along the mounting rail 124 and adjusting rail 122. The locking knob 116 can be used to fix the PDB 112 to the mounting rail 124 and adjusting rail 122 at a locking hole 120. The PDB 112 may include busbar clips 114 for connecting the PDB 112 to the busbars of a server rack when the server chassis 100 is populated to the server rack. Once populated to a server, the PDB 112 can then convert the power provided by the busbars to the power requirements of the circuit board 106 (e.g., 48V/54V to 12V).

FIG. 2 is a diagram of a mounting structure 200 for a PDB of a server chassis, according to embodiments of the disclosure. The adjusting rail 222 can be fixed to a server chassis. The adjusting rail 222 can be compatibly mounted on different types of chassis with different form factors, such as 19-inch or 21-inch chassis types. The mounting structure 200 further includes a mounting rail 224. The mounting rail 224 may be mountable to and adjustable along the length of the adjusting rail 222. Because the adjusting rail 222 is designed for different server platforms, the mounting rail 224 may be configured to accommodate difference server rack configurations.

As depicted in FIG. 2, the adjusting rail 222 and the mounting rail 224 include several sets of stopping grooves 218 and locking holes 220. The benchmarking set 202 of stopping groove 218 and locking hole 220 may be a standard position that can be used across different configurations without regard to the particular configuration. The mounting rail 224 includes two groups of the stopping groove and locking hole (hereinafter referred to in combination as a mounting set). For example, the first group of mounting sets correspond to the mounting locations for a 19-inch server chassis configuration while the second group of mounting sets correspond to the mounting locations for a 21-inch server chassis configuration. The adjusting rail may include mounting sets for each possible position that could correspond to a bus bar position in a rack configuration. Therefore, during installation, a PDB board can be mounted at any of the depicted locations of mounting sets according to the rack busbar design. The adjusting rail can be designed based on actual server chassis specifications, and the mounting rail as well as the corresponding stopping groove and locking hole can be designed following actual rack standard architecture and dimension specifications.

FIG. 3 depicts another example of a mounting structure 300, according to embodiments of the disclosure. Similar to the mounting structure 200 depicted in FIG. 2, the mounting structure 300 includes an adjusting rail 322. However, the mounting rail 324 of the mounting structure 300 includes sectional members of the mounting rail 324 rather than one elongated member. Each of the mounting rail 324 members can be adjusted along the adjusting rail 322 to correspond to different busbar configurations. Therefore, the section members of the mounting rails 324 may provide for flexibility to be compatible with many different server rack busbar configurations. Additionally, the PDB can be assembled to one of the sections of the mounting rail 324 and can then slide along the adjusting rail 322 to the proper position (i.e., to a particular busbar location of a rack configuration).

Figure 4:
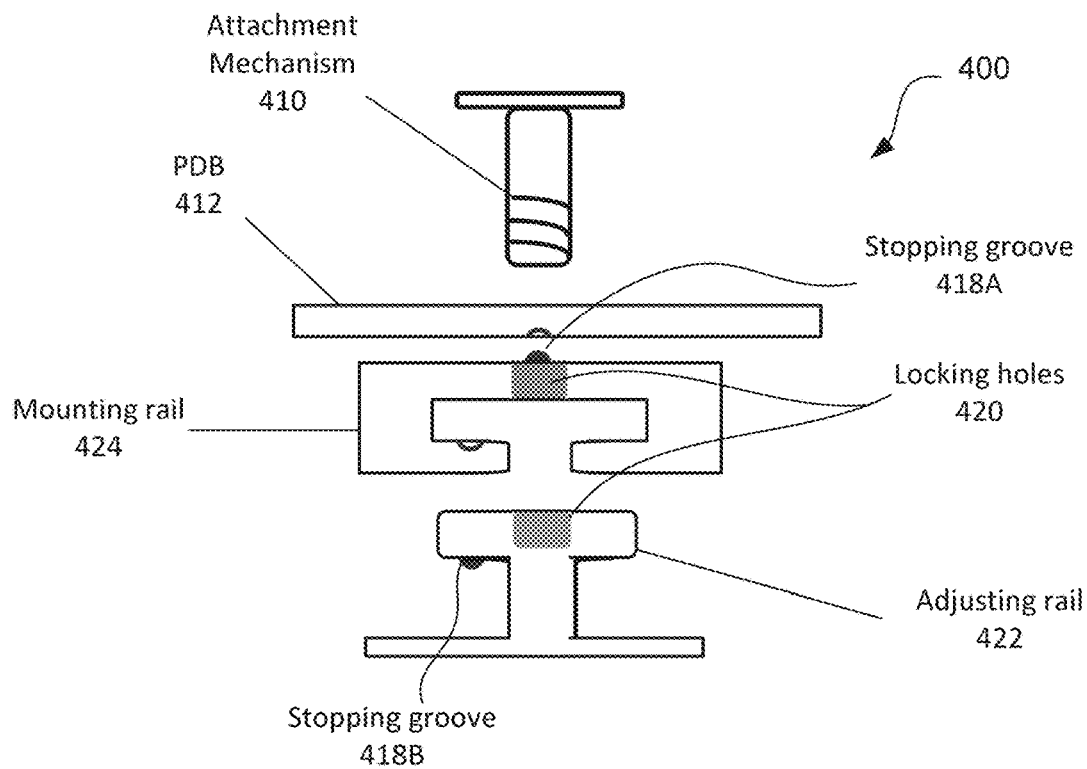
FIG. 4 depicts a side view of the components of a mounting structure, according to some embodiments.

FIG. 4 depicts a side view of the components of a mounting structure 400. The adjusting rail 422 is located on the bottom of the mounting structure and is directly attached to the server chassis (e.g., the sides of the server chassis). In another example, the adjusting rail 422 may be built in as an integrated part of the server chassis. The adjusting rail 422 includes a locking hole 420 for fixing the PDB 412 and mounting rail 424 in place on the adjusting rail 422 using attachment mechanism 410. Therefore, the mounting structure provides for structural support for the PDB 412 and power clip attachment to the bus bar of a server rack. A stopping groove 418A-B can be included on the mounting rail (418A) and the adjusting rail (418B). For example, the stopping groove 418B on the adjusting rail may be used in the embodiment depicted in FIG. 3. The mounting rail 424 is assembled between the PDB 412 and the adjusting rail 422. The mounting rail 424 may also include stopping grooves 418A on a top surface for positioning of the PDB 412 on the mounting rail 424. The mounting rail 424 may further include additional stopping grooves aligned with stopping grooves 418B on the adjusting rail (e.g., for the embodiment of FIG. 3). An attachment mechanism 410 may be used for fastening the PDB 412, the mounting rail 424, and the adjusting rail 422 together. The attachment mechanism 410 may be a screw, or other attachment mechanism, as depicted in FIG. 4.

Figure 5:
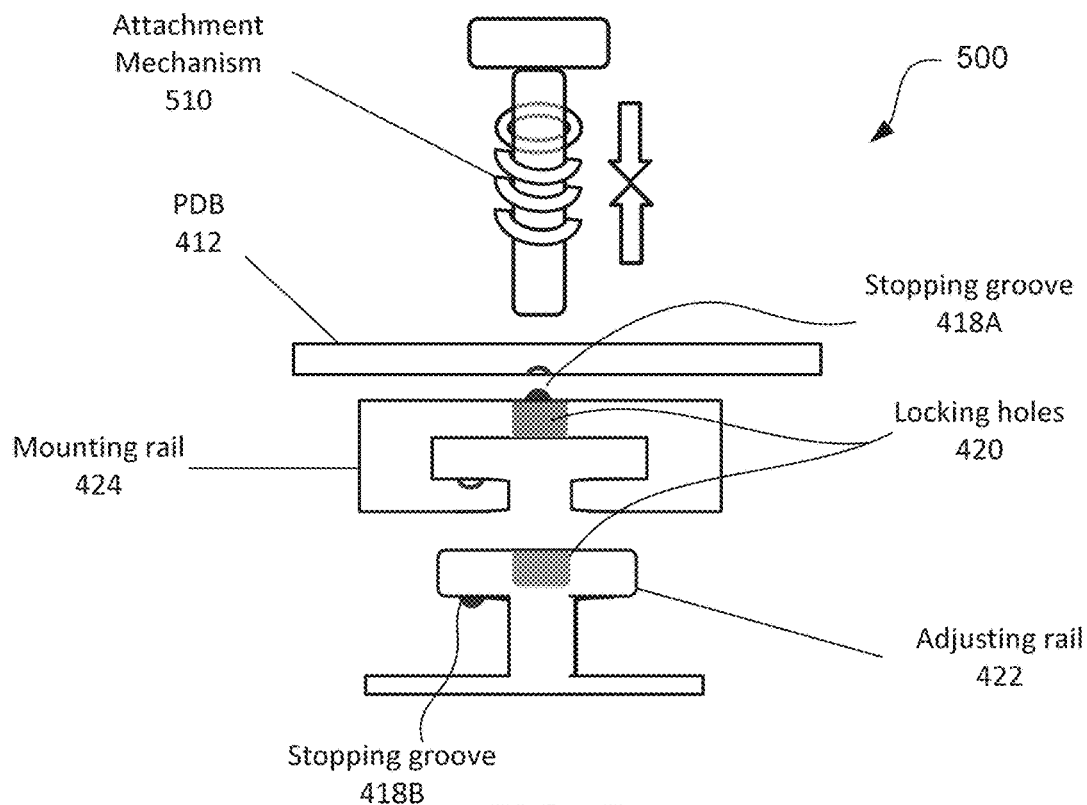
FIG. 5 depicts another side view of the components of a mounting structure, according to some embodiments.

In another example, as depicted in FIG. 5, the attachment mechanism 510 may be a screw, pin, or other mechanism that may be unplugged vertically from the adjusting rail 422 without fully being unplugged from the PDB 412 and the mounting rail 424. For example, the attachment mechanism 510 may include a spring coupled to the screw to provide a downward force on the screw or pin such that when aligned with a locking hole of the attachment mechanism 510, the pin will be forced into the locking hole 420 to fix the position of the PDB 412 and mounting rail 424 on the adjusting rail 422. In some embodiments, any type of attachment mechanism and any type of attachment rail can be used. In some embodiments, the attachment mechanism does not require a tool to be engaged or released.

Figure 6:
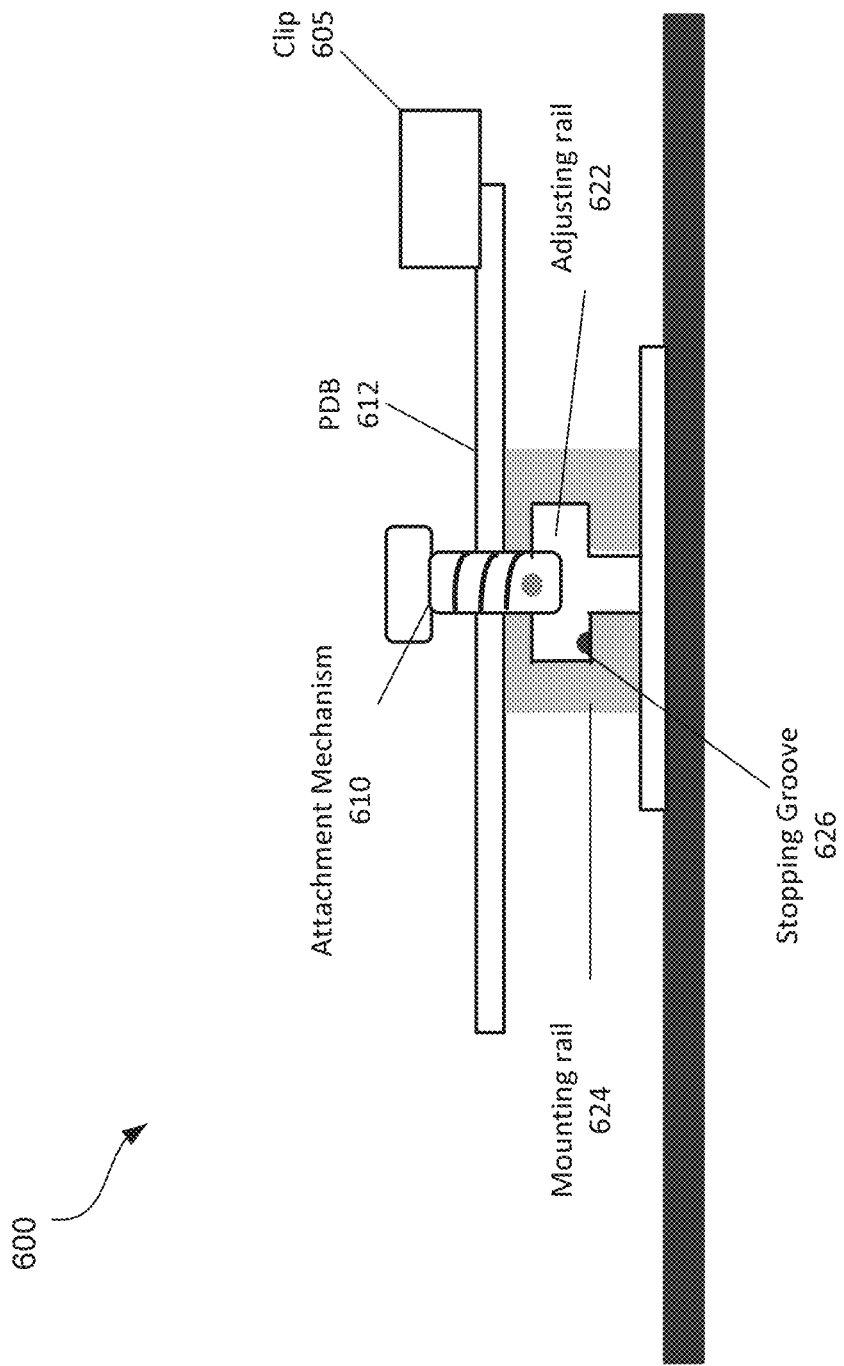
FIG. 6 depicts a side view of the mounting structure as assembled, according to some embodiments.

FIG. 6 depicts a side view of the mounting structure 600 as assembled, according to some embodiments. As described above with respect to FIGS. 4 and 5, the mounting structure 600 includes an adjusting rail 622 and a mounting rail 624 to which the PDB 612 is fixed. The adjusting rail 622 is attached to the server chassis and the PDB 612 and the mounting rail 624 are attached to the adjusting rail 622. The mounting rail 624 and adjusting rail 622 further include one or more stopping grooves 626 for providing resistance to movement of the mounting rail 624 sections (such as those depicted in FIG. 3) along the adjusting rail 622 at particular positions along the adjusting rail 622. For example, the mounting rail 624 may include protruding stopping grooves 626 while the adjusting rail includes indentions for corresponding stopping grooves 626. Therefore, the stopping grooves 626 provide for positioning of the mounting rail 624 sections on the adjusting rail 622 at particular positions corresponding to different rack configurations and power hardware designs. Additionally, one or more bus bar clips 605 are attached to the PDB 612 for connecting the PDB 612 to the bus bars of a server rack. As depicted, an attachment mechanism 610, such as a screw, can be used to fix the PDB 612 and the mounting rail 624 in place on the adjusting rail 622. For example, the mounting rail 624 and the adjusting rail 622 include several sets of locking holes and stopping grooves 626. Therefore, the PDB can be attached to the mounting rail 622 and adjusting rail 624 at one of the sets of stopping grooves and locking holes.

Figure 7:
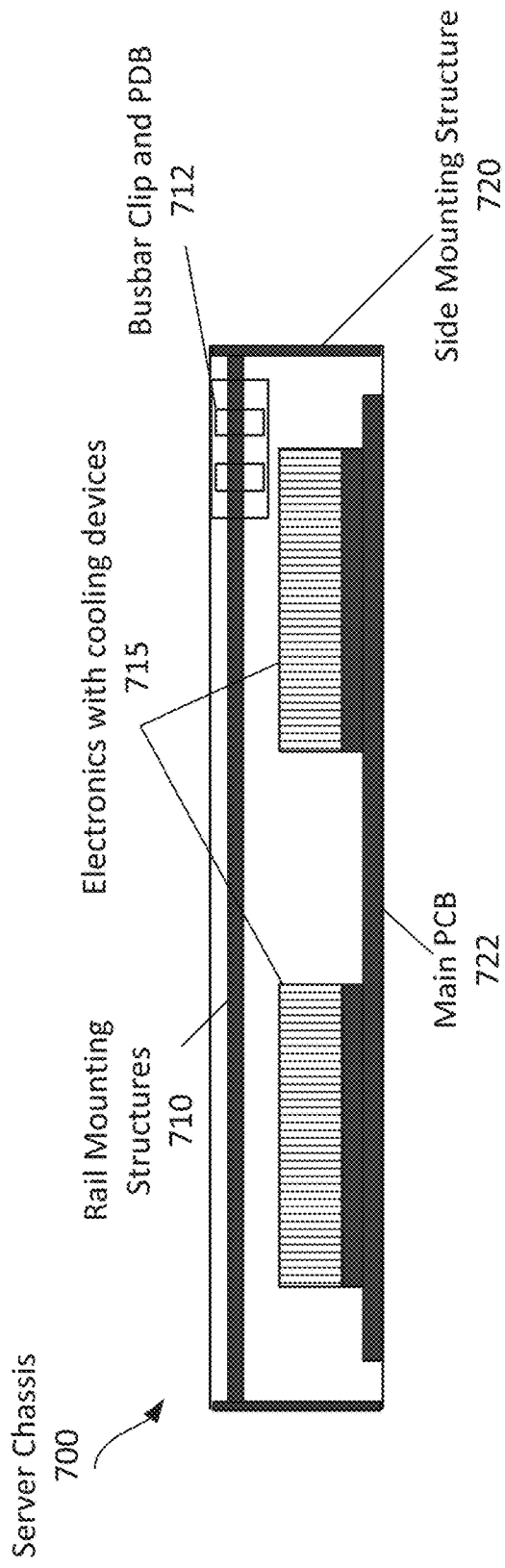
FIG. 7 depicts an example rail mounting structure as mounted in a server chassis, according to some embodiments

FIG. 7 depicts an example rail mounting structure 710 as mounted in a server chassis 700, according to some embodiments. As shown, a rail mounting structure 710 can be attached to a side mounting structure 720 of the server chassis 700. Accordingly, the rail mounting structure 710 can be arranged at any position within the server chassis 700. Since the busbar clip and PDB 712 is movable along the rail mounting structure 710 (as described above), the PDB 712 can be mounted at any horizontal position of the mounting structure at which a locking hole of the rail mounting structure 720 is provided. Accordingly, the rail mounting structures 710 provide for improved efficiency of the server chassis and power delivery system with high compatibility across server rack configurations and server board designs.

Figure 8:
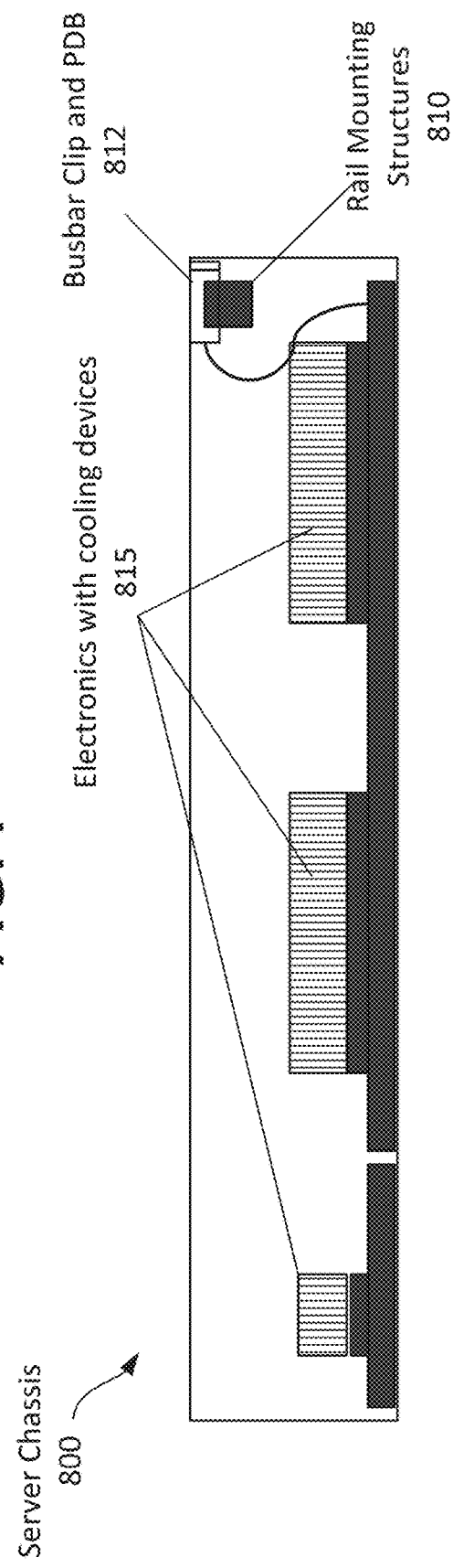
FIG. 8 depicts a side view of a rail mounting structure as mounted in the server chassis, according to some embodiments

FIG. 8 depicts a side view of a rail mounting structure 810 as mounted in the server chassis 800, according to some embodiments. As depicted in FIG. 8, the mounting structure can be mounted at a top and back of the server chassis 800 to provide additional room and flexibility of design of the electronics of the server. For example, this provides the flexibility to use larger electronics boards and cooling devices 815 within the server chassis 800 because the busbar clips and PDB 812 can be mounted anywhere within the server chassis 800.

Figure 9A:
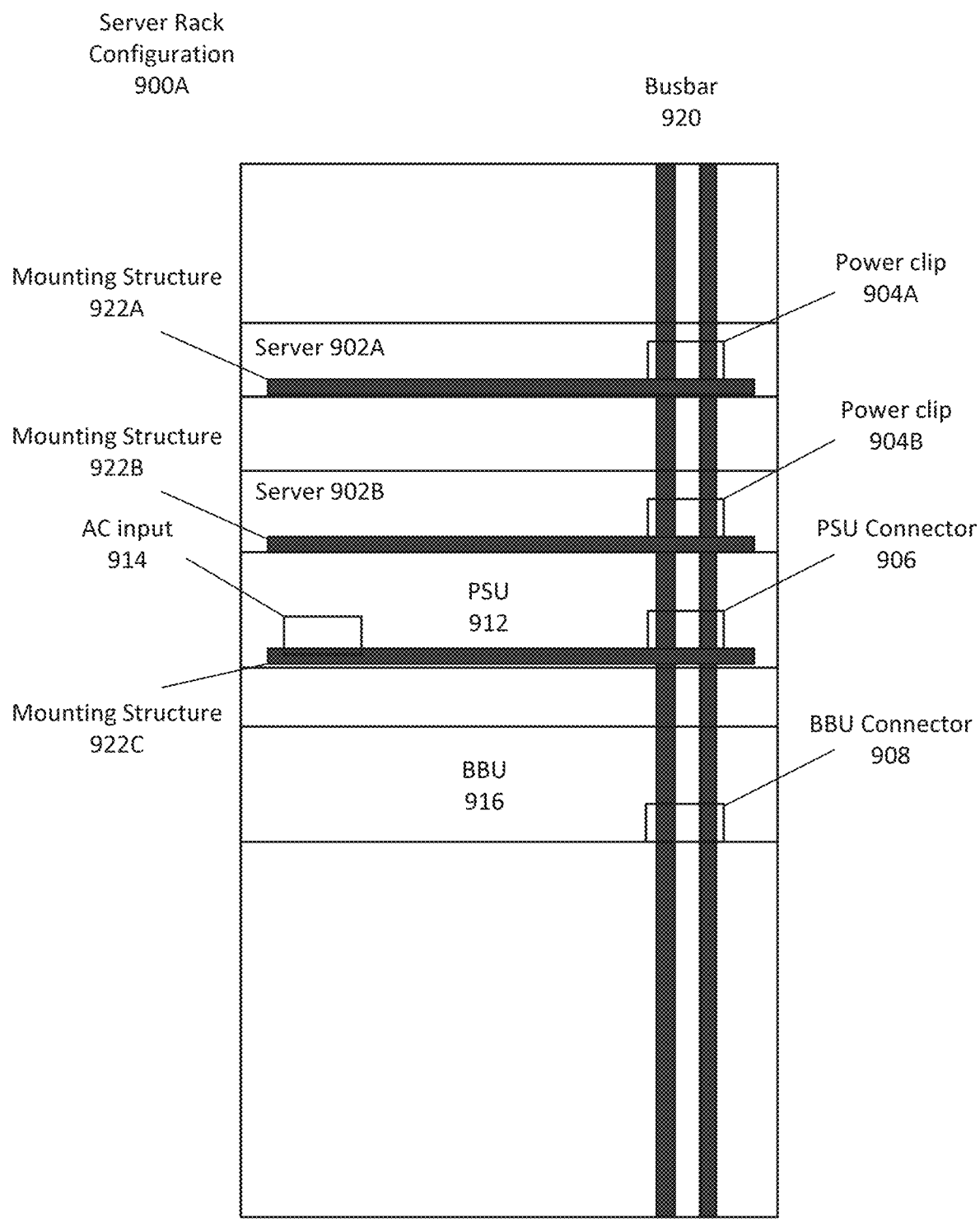
FIG. 9A depicts a server rack configuration with a single busbar located on the right hand side of the server rack.
Figure 9B:
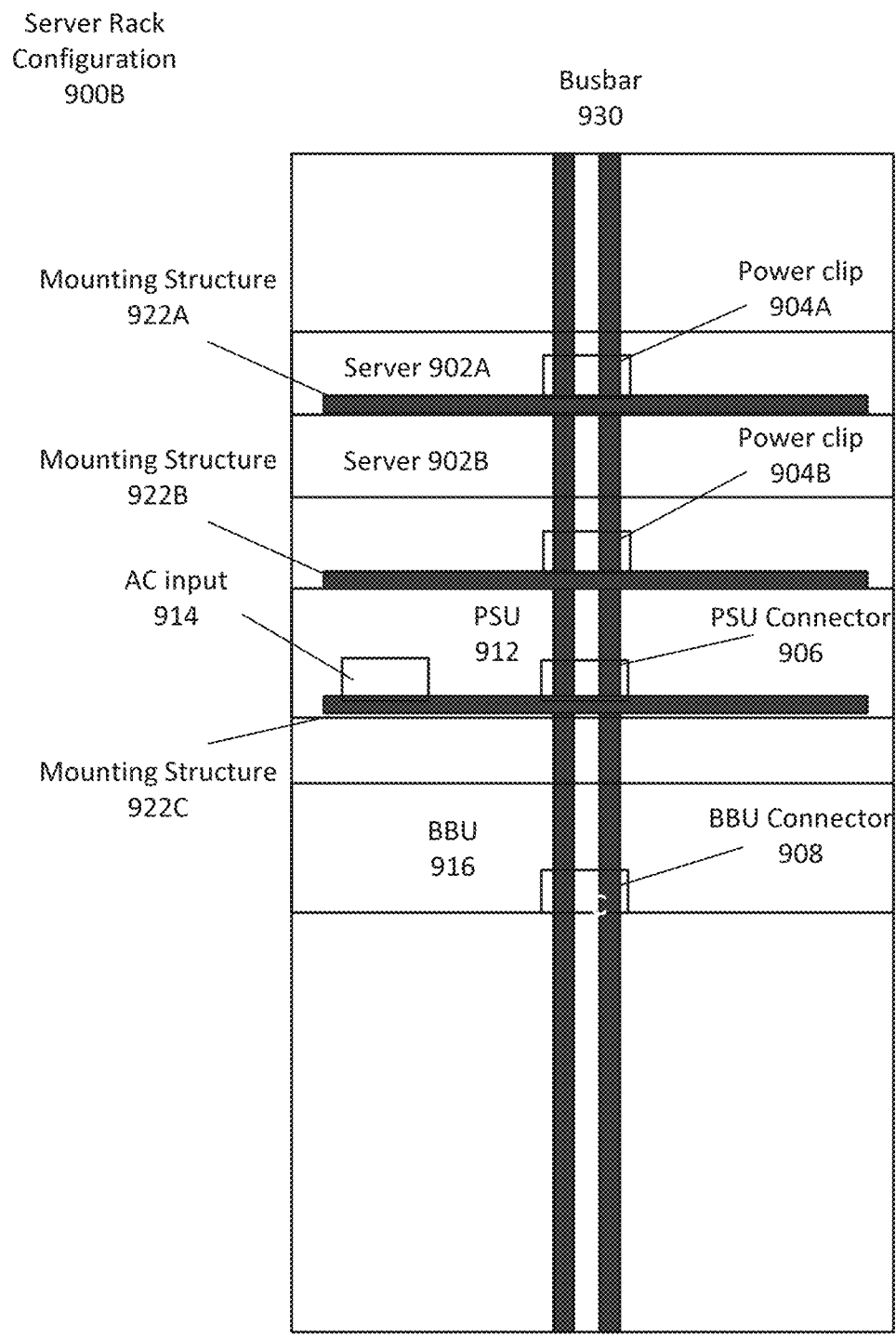
FIG. 9B depicts a server rack configuration with a single busbar location at the middle of the server rack.
Figure 9C:
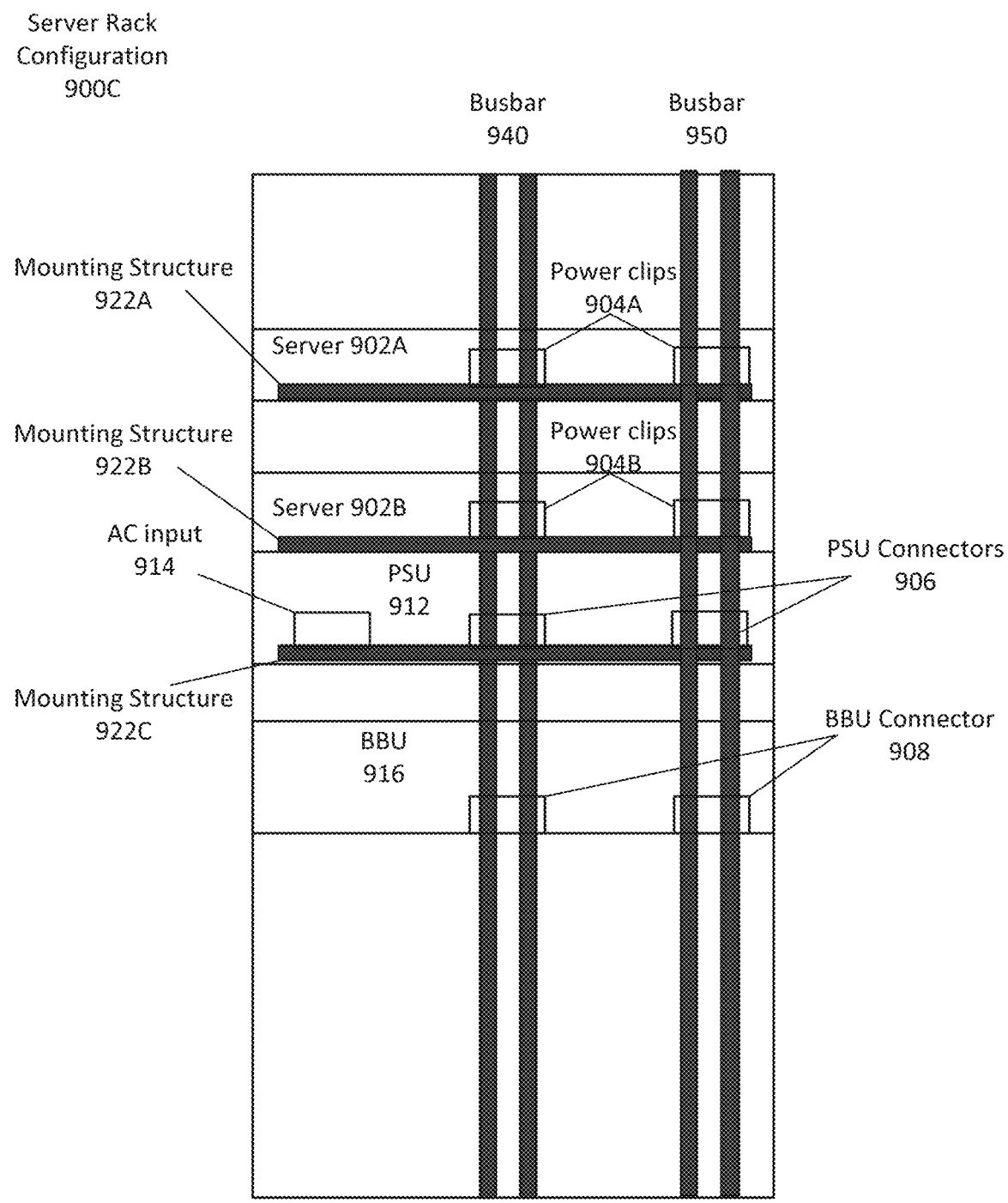
FIG. 9C depicts a server rack configuration with two busbar locations on the right and the middle of the server rack.

FIGS. 9A, 9B, and 9C depict a mounting structure used in conjunction with different server rack and bus bar configurations. FIG. 9A depicts a server rack configuration 900A with a single busbar located on the right hand side of the server rack. FIG. 9B depicts a server rack configuration 900B with a single busbar location at the middle of the server rack. FIG. 9C depicts a server rack configuration 900C with two busbar locations on the right and the middle of the server rack. For example, the two bus bars configuration may be used in high power density racks. The bus bars may alternatively be in any other configuration or location. FIGS. 9A-C illustrate the use compatibility of the mounting structure described herein with different bus bar locations and configurations. Thus, the PDB for servers included in the server racks are not required to be designed for a particular server rack configuration or bus bar location and the PDB can be adjusted to be compatible with the particular configuration with which it is being used. Furthermore, as illustrated, the mounting structure can also be used with different power units such as a power supply unit, a battery backup unit, or any other power unit. Thus, the mounting structure also provides compatibility of power supply units or any other board connecting to the bus bars for providing or receiving power in the server rack.

Referring to FIG. 9A, the server rack 900A includes one or more servers 902A-B, and power supply unit (PSU) 912, and a battery backup unit (BBU) 916. The one or more servers 902A-B may include electronic components for providing compute services. The PSU may provide DC power from an AC input 914 to the servers 902A-B via busbar 920. In one example, the busbar 920 includes one connection for providing power from the PSU and a second connection to ground and complete the circuit. The BBU 916 may include one or more batteries that are connected to the busbar 920 via BBU connector 908 to provide power to the servers 902A-B if a power outage occurs or the PSU 912 is otherwise unable to provide power to the servers 902A-B. Accordingly, each of the servers 902A-B, PSU 912, and BBU 916 are coupled to the busbar 920. In one embodiment, a mounting structure 922 is attached to the server chassis of servers 902A-B to support and configure a PDB and power clips 904A-B for connecting the PDB to the busbar 920. The PDB and busbar clips 904A-B can be adjusted along the mounting structure 922 to provide compatibility with several different server rack busbar configurations. In another example, a mounting structure can also be provided for the PSU connector 906 of the PSU 912 or even the BBU connector 908 of BBU 916. As depicted in FIG. 9A, the PDBs and power clips 904A-B and PSU connector 906 are arranged on a right hands side of the mounting structures 922A-C for compatibility with the busbar 920 that is configured on a right side of the server rack.

Referring to FIG. 9B, the PDBs and power clips 904A-B of servers 902A-B and the PSU connector 906 of PSU 912 are each mounted at a middle location of the mounting structures 922A-C. Therefore, the power clips 904A-B and PSU connector 906 are configured to be compatible with the busbar 930 located at the center of the server rack.

Referring to FIG. 9C, multiple power clips 904A-B and the PSU connectors 906 are positioned on each of the mounting structures 922A-C. The server rack configuration 900C includes two busbars, busbar 940 and 950, for providing power to the servers 902A-B. For example, the servers 902A-B may be power dense servers that require more power than can be provided by a single busbar. Therefore, an additional busbar can be used to provide the requisite power for the components of the servers 902A-B. As depicted, the power clips 904A-B and PSU connectors 906 can be mounted on the mounting structures 922A-C at the corresponding positions of the busbar 940 and busbar 950 for compatibility.

Figure 10:
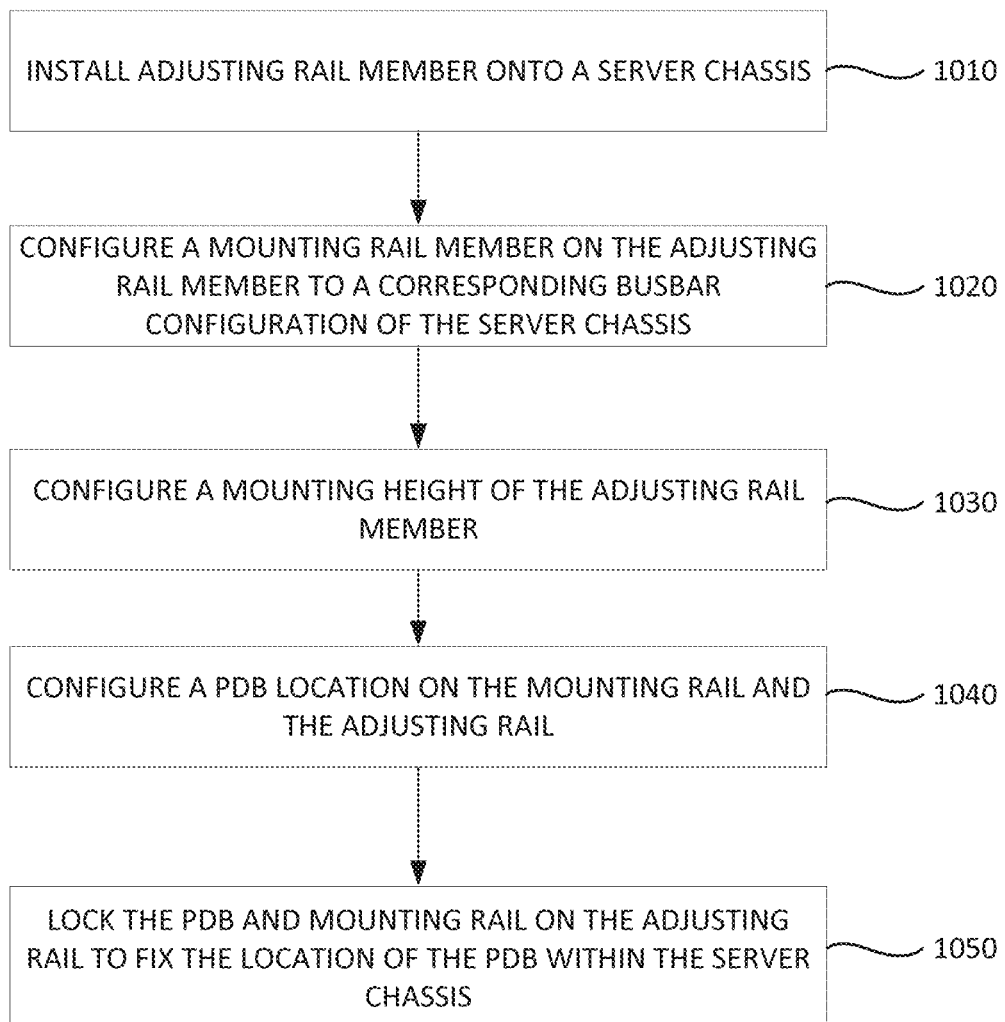
FIG. 10 is a flow diagram illustrating a method 1000 for configuring a PDB on a mounting structure in a server chassis, according to some embodiments

FIG. 10 is a flow diagram illustrating a method 1000 for configuring a PDB on a mounting structure in a server chassis, according to some embodiments. The method 1000 begins at operation 1010, where personnel installs an adjusting rail member onto a server chassis. The adjusting rail member may be mounted at any height within the server chassis. For example, the adjusting rail member can be attached to each side of the server chassis to provide support of a PDB to be mounted on the adjusting rail member.

At operation 1020, the personnel configures a mounting rail on the adjusting rail member to a corresponding bus bar configuration of the server chassis. The mounting rail may be a rail member that can move along the adjusting rail member.

At operation 1030, the personnel configures a mounting height of the adjusting rail member. For example, the mounting height of the adjusting rail member may be adjusted to a height to accommodate the electronic components of a server board.

At operation 1040, the personnel configures a PDB location on the mounting rail and the adjusting rail. In one example, the mounting rail member includes one or more stopping grooves to provide a stopping point for locking positions associated with one or more server rack and busbar configurations.

At operation 1050, the personnel locks the PDB and mounting rail on the adjusting rail to fix the location of the PDB within the server chassis. The PDB can be coupled to the mounting rail and the adjusting rail at a location of the mounting rail and adjusting rail corresponding to the configuration of the server chassis (e.g., at corresponding stopping grooves). The mounting rail and adjusting rail may each have several locking holes at which to attach the PDB and fix the mounting rail to the adjusting rail.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus for mounting a power module to a server chassis, the apparatus comprising:
   a first rail member attachable to a server chassis;
   a second rail member mountable to the first rail member, the second rail member comprising a plurality of mounting points;
   a power distribution board (PDB) coupled to the second rail member at one of the plurality of mounting points, wherein each of the plurality of mounting points comprises:
      a stopping groove to provide resistance to movement of the PDB along the second rail member; and
      a locking hole for fixing the PDB and the second rail member to the first rail member using an attachment mechanism,
   wherein the PDB is to provide power from a power bus of an electronic rack to one or more electronic devices of a server included in the server chassis, the PDB comprising:
      one or more power conversion devices to provide power to the one or more electronic devices of the server; and
      a set of power clips to attach the PDB to the power bus of the electronic rack.

2. The apparatus of claim 1, wherein the second rail member is adjustable along a length of the first rail member.

3. The apparatus of claim 1, wherein the plurality of mounting points comprises a plurality of mounting point groups corresponding to a plurality of server rack configurations and power hardware designs.

4. The apparatus of claim 1, further comprising one or more side mounting structures attachable to a side of the server chassis, wherein the first rail member is attachable to the server chassis via the side mounting structures.

5. The apparatus of claim 1, wherein the second rail member comprises a plurality of sectional members that are each individually adjustable along the first rail member.

6. The apparatus of claim 5, wherein the first rail member comprises a second set of stopping grooves associated with a third set of stopping grooves of the second rail member, the second and third set of stopping grooves to provide resistance to movement of the plurality of section members of the second rail member along a length of the first rail member.

7. An electronic rack of a data center comprising:
a plurality of server shelves to receive a plurality of server chassis, wherein each of the plurality of server chassis comprises:
a first rail member of the server chassis;
a second rail member mountable to the first rail member, the second rail member comprising a plurality of mounting points;
a power distribution board (PDB) coupled to the second rail member at one of the plurality of mounting points, wherein each of the plurality of mounting points comprises:
a stopping groove to provide resistance to movement of the PDB along the second rail member; and
a locking hole for fixing the PDB and the second rail member to the first rail member using an attachment mechanism,
wherein the PDB into provide power from a power bus of an electronic rack to one or more electronic devices of a server included in the server chassis, the PDB comprising:
one or more power conversion devices to provide power to the one or more electronic devices of the server; and
a set of power clips to attach the PDB to a power bus of an electronic rack.

8. The electronic rack of claim 7, wherein the second rail member is adjustable along a length of the first rail member.

9. The electronic rack of claim 7, wherein the plurality of mounting points comprises a plurality of mounting point groups corresponding to a plurality of server rack configurations and power hardware designs.

10. The electronic rack of claim 7, further comprising one or more side mounting structures attachable to a side of the server chassis, wherein the first rail member is attachable to the server chassis via the side mounting structures.

11. The electronic rack of claim 7, wherein the second rail member comprises a plurality of sectional members that are each individually adjustable along the first rail member.

12. The electronic rack of claim 11, wherein the first rail member comprises a second set of stopping grooves associated with a third set of stopping grooves of the second rail member, the second and third set of stopping grooves to provide resistance to movement of the plurality of section members of the second rail member along a length of the first rail member.

13. A method of configuring a power distribution board (PDB) in a server chassis, the method comprising:
installing a first rail member to the server chassis;
mounting a second rail member to the first rail member, the second rail member comprising a plurality of mounting points;
attaching a power distribution board (PDB) to the second rail member at one of the plurality of mounting points, wherein the PDB is to provide power from a power bus of an electronic rack to one or more electronic devices of a server included in the server chassis, wherein attaching the PDB comprises positioning the PDB on the second rail member at the one of the plurality of mounting points, wherein each of the plurality of mounting point comprises:
a stopping groove to provide resistance to movement of the PDB along the second rail member; and
a locking hole for fixing the PDB and the second rail member to the first rail member using an attachment mechanism, the PDB comprising:
one or more power conversion devices to provide power to the one or more electronic devices of the server; and
a set of power clips to attach the PDB to a power bus of an electronic rack.

14. The method of claim 13, wherein mounting the second rail member to the first rail member comprises:
adjusting the second rail member to a position on the first rail member corresponding to a configuration of a server rack.

15. The method of claim 13, wherein attaching the PDB to the second rail member at one of the plurality of mounting points further comprises:
rigidly attaching the PDB to the second rail member.

16. The method of claim 15, wherein the PDB is rigidly attached to the second rail member using an attachment mechanism and a locking hole at the one of the plurality of mounting points.

17. The method of claim 13, wherein installing the first rail member to the server chassis comprises:
attaching the first rail member to one or more side mounting structures of the server chassis, wherein the side mounting structure provides for elevation adjustment of the first rail member.

18. The method of claim 13, wherein the second rail member comprises a plurality of sectional members that are each individually adjustable along the first rail member.

* * * * *